United States Patent [19]

Madhusudhan

[11] Patent Number: 5,049,234

[45] Date of Patent: Sep. 17, 1991

[54] METHODS FOR REMOVING STRINGERS APPEARING IN COPPER-CONTAINING MULTI-LAYER PRINTED WIRING BOARDS

[75] Inventor: Chilengi P. Madhusudhan, Torrance, Calif.

[73] Assignee: Hughes Aircraft Company, Los Angeles, Calif.

[21] Appl. No.: 153,388

[22] Filed: Feb. 8, 1988

Related U.S. Application Data

[63] Continuation-in-part of Ser. No. 9,319, Jan. 30, 1987, abandoned.

[51] Int. Cl.[5] ............................................. C23F 1/00
[52] U.S. Cl. ..................................... 156/644; 156/656; 156/666; 156/901; 156/902; 252/79.2; 252/79.3; 252/79.4; 427/97; 427/309
[58] Field of Search ............... 156/644, 666, 901, 902; 252/79.2, 79.3, 79.4; 427/97, 98, 307, 309

[56] References Cited

U.S. PATENT DOCUMENTS

| | | |
|---|---|---|
| 4,007,037 | 2/1977 | Lukes et al. |
| 4,222,815 | 9/1980 | Krechmery ............... 156/659.1 |
| 4,345,969 | 8/1982 | James et al. ............... 156/666 |
| 4,425,210 | 1/1984 | Fazlin . |
| 4,541,035 | 9/1985 | Carlson et al. ............. 361/413 |
| 4,546,374 | 10/1985 | Olsen et al. ............... 357/72 |
| 4,615,907 | 10/1986 | Boeke et al. ............. 427/53.1 |
| 4,631,805 | 12/1986 | Olsen et al. ............... 437/211 |
| 4,657,632 | 4/1987 | Holtzman et al. ......... 427/126.1 |
| 4,695,348 | 9/1987 | Battey et al. ............. 156/666 |

Primary Examiner—David A. Simmons
Assistant Examiner—Thi Dang
Attorney, Agent, or Firm—M. E. Lachman; W. J. Streeter; W. K. Denson-Low

[57] ABSTRACT

Copper-containing multilayer substrates are etched, and stringers formed in the plated through-holes in these substrates are simultaneously removed by treatment with an aqueous composition including about 37% by weight hydrofluoric acid and about 16% by weight nitric acid. The same aqueous composition can be used to remove stringers formed during treatment of such substrates with other etchants.

8 Claims, 1 Drawing Sheet

METHODS FOR REMOVING STRINGERS APPEARING IN COPPER-CONTAINING MULTI-LAYER PRINTED WIRING BOARDS

This application is a continuation-in-part of application Ser. No. 07/009,319, filed Jan. 30, 1987, now abandoned.

BACKGROUND OF THE INVENTION

1. Field of the Invention

This invention relates to methods for removing stringers appearing in plated through-holes in copper-containing multilayer substrates such as printed wiring boards comprising copper layers and layers of reinforced resin, such as polyimide on glass cloth or epoxy on glass cloth.

2. Description of Related Art

During the foil microetching that takes place immediately before electroless copper plating to provide good adhesion of copper, "stringers" are formed in copper foil containing multilayer substrates such as printed wiring boards. These stringers or tails are often formed from strands of copper, polymeric fiber, or both. These tails, which emanate from the rough brass side of copper foil in plated through-holes, act as nucleation sites for the electroless copper and can introduce stress raisers or planes of weakness in the plated layer. Such stringers can also lead to instability and cause barrel cracking (i.e., cracking in the walls of plated through holes) and electrical failures. Attempts to remove these stringers by contacting them with ammonium persulfate and other known etchants have failed.

SUMMARY OF THE INVENTION

This invention provides methods for removing or at least minimizing the number of stringers appearing during etching in plated through-holes in copper foil-containing multilayer substrates such as printed wiring boards having one or more copper layers and one or more layers of reinforced resin, such as polyimide resin or epoxy resin on glass cloth, with or without fiberglass. These methods are particularly effective with copper foils weighing up to 2 ounces per square foot (0.061 grams per square centimeter). These methods comprise contacting the substrate with a solution comprising about 37% by weight hydrofluoric acid, about 16% by weight nitric acid and about 47% by weight water to etch the substrate and to simultaneously remove stringers. The new solution may also contain minor amounts, e.g., up to about 5.4% by weight of acetic acid, to lengthen the shelf life and to minimize deterioration resulting from aging of the solution.

This invention also provides methods for removing or at least minimizing the number of stringers appearing during etching in plated through-holes in such copper foil containing multilayer substrates with an etchant other than this new hydrofluoric acid/nitric acid/water solution.

The contacting preferably takes place at room temperature, at atmospheric pressure and for a time sufficient to remove the stringers, typically a time in the range of about 20 to about 22 seconds.

DESCRIPTION OF THE PREFERRED EMBODIMENTS

The composition of this invention is formed by mixing hydrofluoric acid with nitric acid and, if desired, glacial acetic acid, and then diluting the mixture of acids with de ionized water in an appropriate amount to form a composition comprising about 37% by weight hydrofluoric acid, about 16% by weight nitric acid, up to about 5.4% by weight acetic acid, and the balance deionized water.

BRIEF DESCRIPTION OF THE DRAWING

The drawing provides a graphical representation of the relative etching effectiveness of this solution as compared to the known microetchant ammonium persulfate.

EXAMPLE 1

Figure 1:
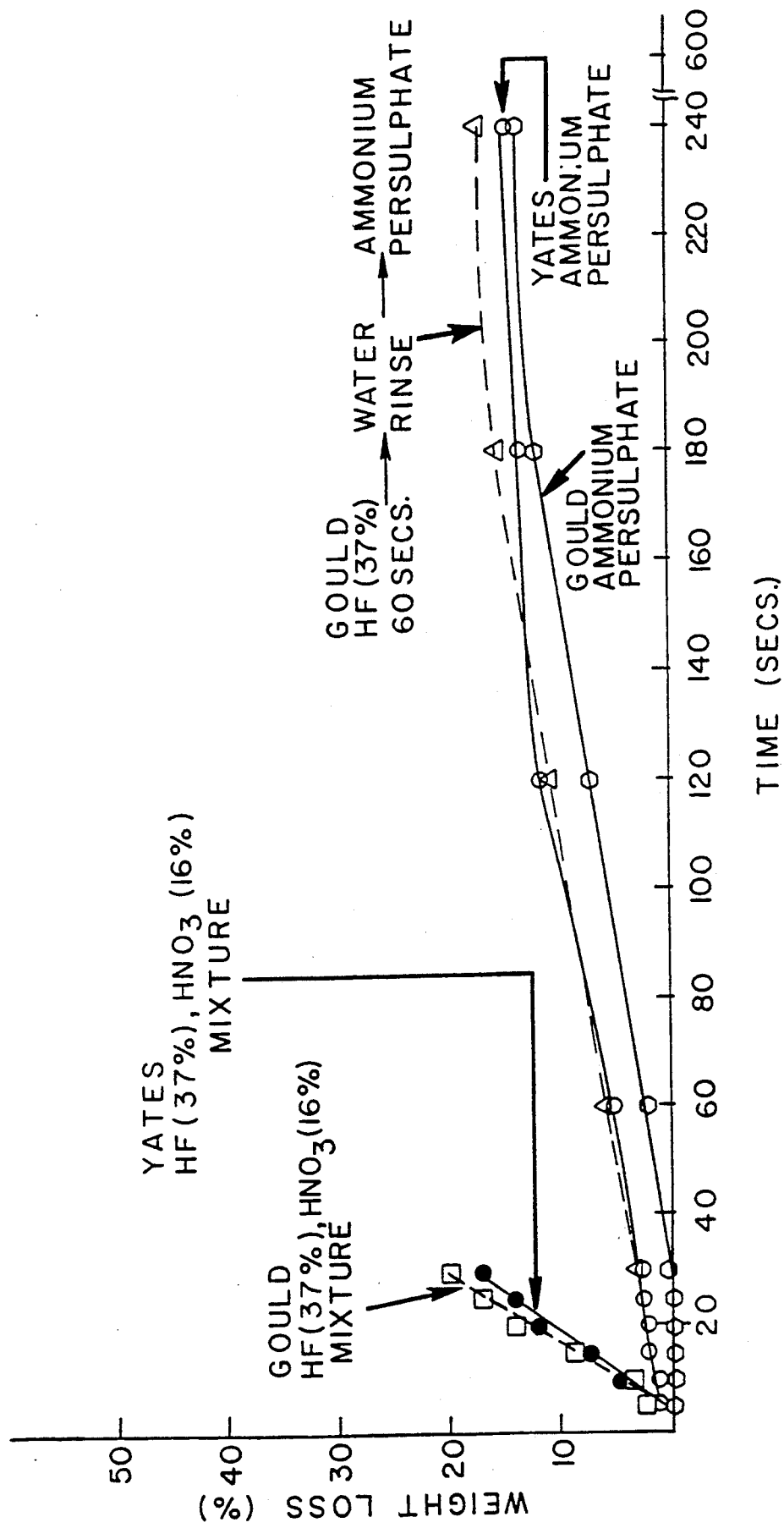

This example provides data showing the etching effectiveness of the new solution.

We obtained copper foil sheets weighing one ounce per square foot from Gould, Inc., Foil Division, of Eastlake, Ohio, and from Yates Industries, Inc., of Bordentown, N.J. We cut these foil sheets into coupons measuring one inch by one-inch and used these coupons to test the microetchants for copper. We prepared a series of etchant solutions from 49% HF, 71% $HNO_3$, 99.9% glacial acetic acid ($CH_3COOH$), and deionized water, mixed in appropriate amounts to obtain the formulations shown in Table I below. We prepared an ammonium persulfate etchant by mixing 21 pounds (9,521 grams) of ammonium persulfate in 0.4 gallon (1.512 liters) of sulfuric acid and deionized water to give a total volume of 30 gallons (113 4 liters).

We immersed preweighed coupons of Yates and Gould copper foil sheets in the various etchants for different lengths of time, then rinsed each coupon in deionized water, dried each of them in air and weighed each of them. We then correlated weight loss from immersion in microetchant with the efficiency of the microetchant.

TABLE I

| COMPOSITION OF ETCHING SOLUTIONS (Weight Percent) | |
|---|---|
| No. | Etchant |
| 1 | 37.0% HF, 63.0% deionized $H_2O$ |
| 2 | 12.8% $HNO_3$, 87.2% $H_2O$ |
| 3 | 33.5% $HNO_3$, 66.5% $H_2O$ |
| 4 | 43.5% $HNO_3$, 56.5% $H_2O$ |
| 5 | 50.2% $HNO_3$, 49.8% $H_2O$ |
| 6 | 8.4% $HNO_3$, 8.7% $CH_3COOH$, 82.9% $H_2O$ |
| 7 | 16.8% $HNO_3$, 3.5% $CH_3COOH$, 79.7% $H_2O$ |
| 8 | 33.5% $HNO_3$, 3.4% $CH_3COOH$, 63.1% $H_2O$ |
| 9 | 36.9% HF, 16.4% $HNO_3$, 46.7% $H_2O$ |
| 10 | 36.9% HF, 16.4% $HNO_3$, 1.4% $CH_3COOH$, 45.3% $H_2O$ |
| 11 | 36.9% HF, 16.4% $HNO_3$, 2.7% $CH_3COOH$, 44.0% $H_2O$ |
| 12 | 36.9% HF, 16.4% $HNO_3$, 5.4% $CH_3COOH$, 41.3% $H_2O$ |
| 13 | 36.9% HF, 13.0% $HNO_3$, 50.1% $H_2O$ |
| 14 | 36.9% HF, 12.9% $HNO_3$, 2.8% $CH_3COOH$, 47.4% $H_2O$ |
| 15 | 21 pounds (9,521 grams) of ammonium persulfate and 0.4 gallon (1.512 liters) of $H_2SO_4$ diluted to 30 gallons (113.4 liters) with $H_2O$ |

We evaluated the shelf-life of the etchants by immersion-testing the etchants in the manner described above after storing the etchants in closed polyethylene bottles for varying lengths of time. We evaluated aging behavior of the etchants by immersion-testing the etchants in the manner described above after exposing the etchants to the atmosphere for varying lengths of time.

The new microetchant solution (No. 9, Table I), comprising 36.9% by weight hydrofluoric acid, 16.4% by weight nitric acid and 46.7% by weight deionized water etched about 13% of copper from the foil in 22 seconds, as FIG. 1 shows. By contrast, to etch 13% by weight of copper from a duplicate foil using ammonium persulfate solution (No. 15, Table I) required more than 140 seconds, as FIG. 1 shows.

Reducing the concentration of nitric acid from 16.4% to 13.0% in the microetchant solution increased the time required to remove 13% by weight of the copper from a duplicate foil to about 60 seconds. Thirty-seven percent hydrofluoric acid alone (No. 1, Table I) or 12.8% nitric acid alone (No. 2, Table I) will not etch copper and remove stringers.

EXAMPLE 2

This example provides data showing the effectiveness of the new solution in removing stringers.

We tested 387 multilayer, printed wiring boards, some of which comprised layers of fiberglass-reinforced polyimide on glass cloth and copper layers (0.5 ounce per square foot or 0.0153 grams per square centimeter), and some of which comprised layers of fiberglass-reinforced epoxy on glass cloth and copper layers (0.5 ounce per square foot or 0.0153 grams per square centimeter).

Of these, we treated 129 plated through-holes in printed wiring boards with ammonium persulfate; 129 others with no stringer-removing composition; and 129 others with the new solution, comprising 36.9% by weight hydrofluoric acid, 16.4% by weight nitric acid and the balance deionized water After treatment, the boards were plated with copper, microsectioned and subjected to microscopic examination. The number of stringers formed appeared to be independent of the type of substrate used, but rather depended on the roughness of the copper layer.

Of the 129 printed wiring boards treated with the solution of the present invention, only two boards had stringers after treatment. By contrast, of the 129 boards treated with ammonium persulfate, 48 had stringers after the treatment. Of the boards treated with no microetchant composition whatsoever, no stringers were observed. However, treatment with microetchant is necessary to clean the surface and to obtain good adhesion of electroless copper in the plated through-holes in the printed wiring boards.

We determined that a composition containing significantly less than about 16% nitric acid and about 37% hydrofluoric acid slowed the rate of copper etching and did not remove stringers. A composition containing significantly more than about 16% nitric acid and about 37% hydrofluoric acid etched the copper so rapidly that the process could not be monitored and controlled.

What is claimed is:

1. A method for etching copper in plated through-holes in a multilayer substrate comprising layers of copper and reinforced resin before metal plating said substrate comprising contacting said substrate with a composition comprising an aqueous solution of about 37 percent by weight hydrofluoric acid, and about 16 percent by weight nitric acid.

2. The method of claim 1 wherein the reinforced resin is selected from the group consisting of polyimide on glass cloth and epoxy on glass cloth.

3. The method of claim 1 wherein said copper comprises a foil weighing up to two ounces per square foot (0.061 grams per square centimeter).

4. The method of claim 1 wherein said composition further includes up to about 5.4 percent by weight acetic acid.

5. A method for removing stringers formed during etching of copper in plated-through holes in a multilayer substrate comprising layers of copper and reinforced resin, said method comprising contacting said stringers with a composition comprising an aqueous solution of about 37 percent by weight hydrofluoric acid and about 16 percent by weight nitric acid.

6. The method of claim 5 wherein the reinforced resin is selected from the group consisting of polyimide on glass cloth and epoxy on glass cloth.

7. The method of claim 5 wherein said copper comprises a foil having a weight of up to about two ounces per square foot (0.061 grams per square centimeter).

8. The method of claim 5 wherein said composition further includes up to 5.4 percent by weight acetic acid.

* * * * *